United States Patent
Kim

(10) Patent No.: US 7,613,215 B2
(45) Date of Patent: Nov. 3, 2009

(54) HIGH EFFICIENCY SECOND HARMONIC GENERATION VERTICAL EXTERNAL CAVITY SURFACE EMITTING LASER

(75) Inventor: Jun-youn Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 34 days.

(21) Appl. No.: 11/443,251

(22) Filed: May 31, 2006

(65) Prior Publication Data

US 2007/0116078 A1    May 24, 2007

(30) Foreign Application Priority Data

Nov. 22, 2005    (KR) .................. 10-2005-0111977

(51) Int. Cl.
*H01S 3/10*    (2006.01)
(52) U.S. Cl. .................. 372/22; 372/23; 372/43.01; 372/50.1; 372/50.11
(58) Field of Classification Search ............... 372/22, 372/21, 23, 43.01, 50.1, 50.11, 50.124, 70, 372/75, 96
See application file for complete search history.

(56) References Cited

U.S. PATENT DOCUMENTS

| | | | | |
|---|---|---|---|---|
| 6,097,742 A | * | 8/2000 | Caprara et al. | 372/22 |
| 6,630,994 B2 | * | 10/2003 | Morris et al. | 356/215 |
| 6,735,234 B1 | * | 5/2004 | Paschotta et al. | 372/75 |
| 2005/0036528 A1 | * | 2/2005 | Schmid | 372/36 |
| 2007/0110118 A1 | | 5/2007 | Kim et al. | |
| 2007/0165689 A1 | | 7/2007 | Lee et al. | |

OTHER PUBLICATIONS

Silfvast, William T. Laser Fundamentals. New York: Cambridge University Press, 2004.*

* cited by examiner

*Primary Examiner*—Minsun Harvey
*Assistant Examiner*—Xnning Niu
(74) *Attorney, Agent, or Firm*—Cantor Colburn LLP

(57) ABSTRACT

A vertical external cavity surface emitting laser (VECSEL) in which the full-width at half maximum (FWHM) of laser light is reduced by two etalon filter layers to improve the efficiency of second harmonic (SHG) crystal is provided. The VECSEL includes: a laser chip for generating laser light; a first etalon filter layer formed on the laser chip; a second etalon filter layer that is formed on the first etalon filter layer and has a different refractive index than the first etalon filter layer; a first mirror separated from and disposed obliquely to the laser chip; a second mirror for reflecting the laser light reflected from the first mirror back to the first mirror to form a cavity with the laser chip; and an SHG crystal disposed along an optical path between the first and second mirrors and doubles the frequency of the laser light generated in the laser chip.

34 Claims, 5 Drawing Sheets

HIGH EFFICIENCY SECOND HARMONIC GENERATION VERTICAL EXTERNAL CAVITY SURFACE EMITTING LASER

CROSS-REFERENCE TO RELATED PATENT APPLICATION

This application claims the benefit of Korean Patent Application No. 10-2005-0111977, filed on Nov. 22, 2005 in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface emitting laser (VECSEL), and more particularly, to a VECSEL in which the efficiency of a second harmonic generation (SHG) crystal is improved by reducing a full-width at half maximum (FWHM) of laser light using two etalon filters.

2. Description of the Related Art

A vertical external cavity surface emitting laser (VECSEL) is a laser device having a high output of several to several tens of Watts by replacing an upper mirror of a vertical cavity surface emitting laser (VCSEL) with an external mirror and increasing a gain region.

FIG. 1 is a schematic view of a conventional VECSEL 10. Referring to FIG. 1, the VECSEL 10 includes a laser chip 18 including a Distributed Bragg Reflector (DBR) layer 11 and an active layer 12, a heat spreader 13 for cooling the laser chip 18, a first mirror 15 separated from the laser chip 18, and a second mirror 17 reflecting laser light reflected from the first mirror 15 back to the first mirror 15. The VECSEL 10 further includes a second harmonic generation (SHG) crystal 16 doubling the frequency of the light along an optical path between the second mirror 17 and the first mirror 15. A birefringence filter 14 is disposed along an optical path between the first mirror 15 and the laser chip 18. As is well known in the art, the active layer 12 may have a multiple quantum well structure having a resonant periodic gain (RPG) structure, and is excited by a pumping beam to emit light at a predetermined wavelength.

In the above described configuration, when a pumping beam emitted from a pump laser (not shown) is incident on the active layer 12, the active layer 12 is excited and emits light at a predetermined wavelength. As illustrated in FIG. 1, the VECSEL 10 may have a structure in which a pumping beam is incident on a bottom surface of the active layer 12 or a structure in which a pumping beam is obliquely incident on a top surface of the active layer 12. The laser light generated in the active layer 12 is reflected by the DBR layer 11 to the first mirror 15 and is reflected again by the first mirror 15 to the second mirror 17. Thus the wavelength of the laser light is reduced by half by the SHG crystal 16. For example, if the laser light generated in the active layer 12 is infrared light having a main wavelength of 920 nm, the light passing through the SHG crystal 16 becomes visible light having a main wavelength of 460 nm.

The second mirror 17 has high reflectivity with respect to the visible light, and may be coated to slightly transmit the infrared light whose wavelength is not converted. Accordingly, the light which is converted by the SHG crystal 16 is reflected by the second mirror 17, and is output to the outside through the first mirror 15. The infrared light whose wavelength is not converted can be output to the outside through the second mirror 17. The birefringence filter 14 filters laser light and allows laser light at a predetermined wavelength to resonate. Furthermore, the heat spreader 13 exhausts heat generated in the active layer 12 to cool the active layer 12.

The SHG crystal 16, as illustrated in FIG. 2, has high wavelength conversion efficiency at a very narrow wavelength band. That is, the SHG crystal 16 has wavelength conversion characteristics of a very narrow full-width at half maximum (FWHM). For example, when the SHG crystal 16 is periodically poled stoichiometric lithium tantalate (PPSLT), the FWHM is about 0.1-0.2 nm. However, the FWHM of the laser light in the infrared light range which is output by the second mirror 17 is relatively large, and thus the conversion efficiency of the SHG crystal 16 is lowered. For example, without the birefringence filter 14 and the heat spreader 13, the FWHM of the output laser light is about 1.6 nm, and thus most of the laser light is not wavelength-converted and wasted.

The FWHM of the output laser light can be reduced to some extent by the birefringence filter 14 and the heat spreader 13. Generally, the FWHM of the laser light is decreased when the thicknesses of the birefringence filter 14 and the heat spreader 13 are increased. For example, when the thickness of the heat spreader 13 is 300 μm and the thickness of the birefringence filter 14 is 4 mm, the laser light has a FWHM of 0.29 nm at a main wavelength of 920 nm and a FWHM of 0.35 nm at a main wavelength of 1064 nm. When the thickness of the heat spreader 13 is 500 μm and the thickness of the birefringence filter 14 is 4 mm, the laser light has a FWHM of 0.26 nm at a main wavelength of 920 nm and a FWHM of 0.3 nm at a main wavelength of 1064 nm. When the thickness of the heat spreader 13 is 500 μm and the thickness of the birefringence filter 14 is 6 mm, the laser light has a FWHM of 0.26 nm at a main wavelength of 920 nm and a FWHM of 0.27 nm at a main wavelength of 1064 nm. However, to have a sufficiently small FWHM, the thicknesses of the birefringence filter 14 and the heat spreader 13 must be very large, and thus the manufacturing costs increase and the size of the VECSEL increases as well. Moreover, when the thicknesses of the birefringence filter 14 and the heat spreader 13 increase, the output power of the laser light decreases. Therefore, it is difficult and impractical to reduce the FWHM of laser light by increasing the thicknesses of the birefringence filter 14 and the heat spreader 13.

SUMMARY OF THE DISCLOSURE

The present disclosure may provide a high efficiency vertical external cavity surface emitting laser (VECSEL) in which the wavelength conversion efficiency of a second harmonic generation (SHG) crystal is increased by reducing a full-width at half maximum (FWHM) of laser light.

According to an aspect of the present invention, there may be provided a VECSEL comprising: a laser chip for generating laser light at a predetermined wavelength; a first etalon filter layer formed on the laser chip; a second etalon filter layer that is formed on the first etalon filter layer and has a different refractive index than the first etalon filter layer, the first and second etalon filter layers being adapted to reduce a full-width at half maximum (FWHM) of the laser light; a first mirror separated from and disposed obliquely to the laser chip; a second mirror for reflecting the laser light reflected from the first mirror back to the first mirror to form a cavity with the laser chip; and a second harmonic generation (SHG) crystal that is disposed along an optical path between the first mirror and the second mirror and adapted to double the frequency of the laser light generated in the laser chip.

The first etalon filter layer and the second etalon filter layer may have transmittance with respect to the laser light generated in the laser chip.

The first etalon filter layer may be a heat spreader which is able to exhaust heat generated in the laser chip.

The first etalon filter layer may be formed of a material selected from the group consisting of diamond, $Al_2O_3$, and silicon carbide (SiC). The second etalon filter layer may be formed of a material selected from the group consisting of GaAs, InP, SiC, diamond, and $Al_2O_3$.

A coating layer may be further interposed between the laser chip and the first etalon filter layer to increase the transmittance of the laser light at the interface between the laser chip and the first etalon filter layer. Also, a coating layer may be further interposed between the first etalon filter layer and the second etalon filter layer to increase the transmittance of the laser light at the interface between the first and second etalon filter layers. The coating layer may be formed by alternately stacking two semiconductor materials or dielectric materials having different refractive indexes.

A birefringence filter may be further disposed between the first mirror and the laser chip to transmit the laser light at the predetermined wavelength.

The laser chip may comprise: an active layer for generating the laser light upon excitation by a pumping beam, the active layer including a multiple quantum well structure and being positioned beneath the first etalon filter layer; and a Distributed Bragg Reflector (DBR) layer for reflecting the laser light generated in the active layer to the first mirror, the DBR layer being positioned beneath the active layer.

The second mirror may have predetermined transmittance with respect to a first portion of the laser light whose frequency is not converted by the SHG crystal and the first mirror may have a predetermined transmittance with respect to a second portion of the laser light whose frequency is converted by the SHG crystal.

The first mirror may be a concave mirror and the second mirror may be a planar mirror.

According to another aspect of the present invention, there may be provided a VECSEL comprising: a laser chip for generating laser light at a predetermined wavelength; a first etalon filter layer formed on the laser chip; a second etalon filter layer that is formed on the first etalon filter layer and has a different refractive index than the first etalon filter layer, the first and second etalon filter layers being adapted to reduce a full-width at half maximum (FWHM) of the laser light; a mirror for reflecting the laser light generated in the laser chip back to the laser chip thereby causing the laser light to resonate between the laser chip and the mirror; and a second harmonic generation (SHG) crystal that is disposed along an optical path between the laser chip and the mirror and adapted to double the frequency of the laser light emitted from the laser chip.

A birefringence filter may be further disposed between the mirror and the laser chip to transmit the laser light at the predetermined wavelength.

Also, a lens may be further disposed between the birefringence filter and the SHG crystal to focus the laser light on the SHG crystal.

BRIEF DESCRIPTION OF THE DRAWINGS

The above and other features and advantages of the present invention will be described in detailed exemplary embodiments thereof with reference to the attached drawings in which.

DETAILED DESCRIPTION OF THE PREFERRED EMBODIMENTS

The present invention will now be described more fully with reference to the accompanying drawings, in which exemplary embodiments of the invention are shown.

Figure 1:
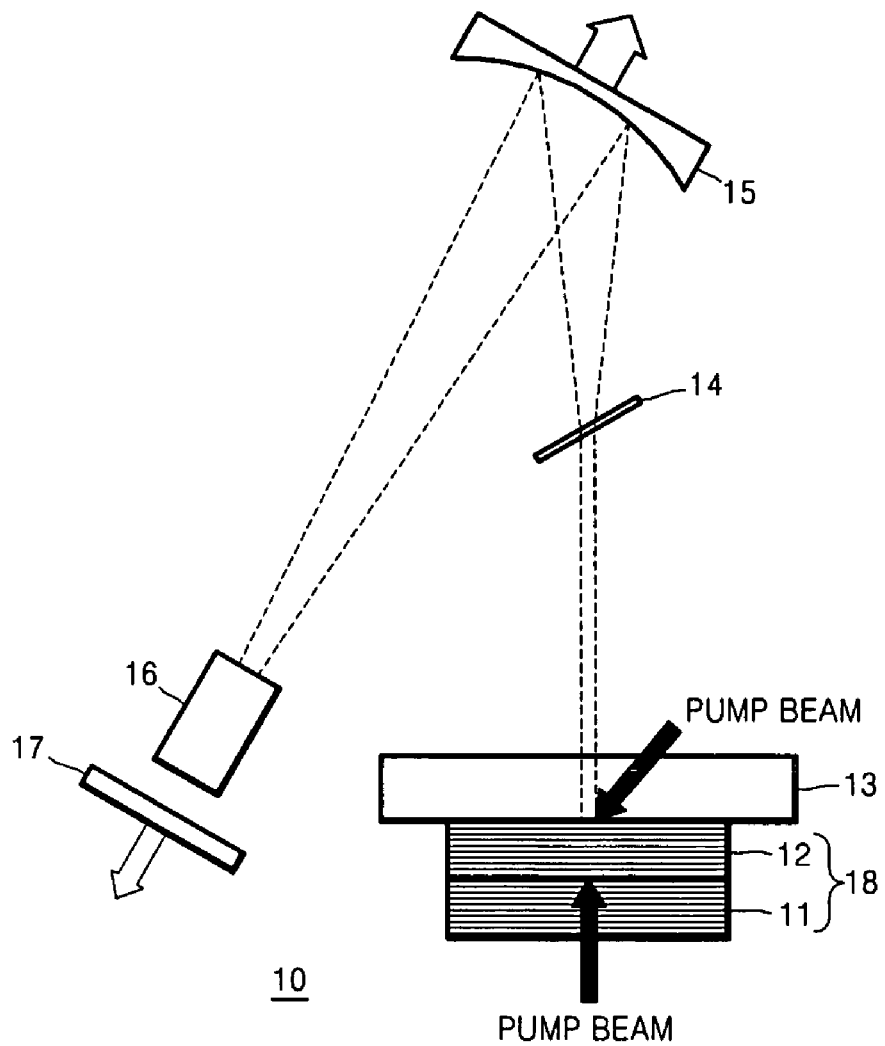
FIG. 1 is a schematic view of a conventional vertical external cavity surface emitting laser (VECSEL)
Figure 2:
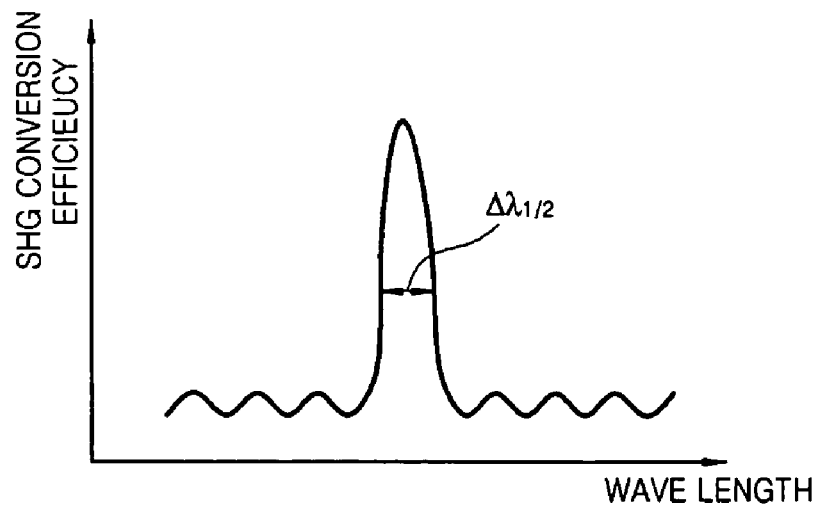
FIG. 2 is a graph of efficiency of a second harmonic generation (SHG) crystal according to wavelengths.
Figure 3:
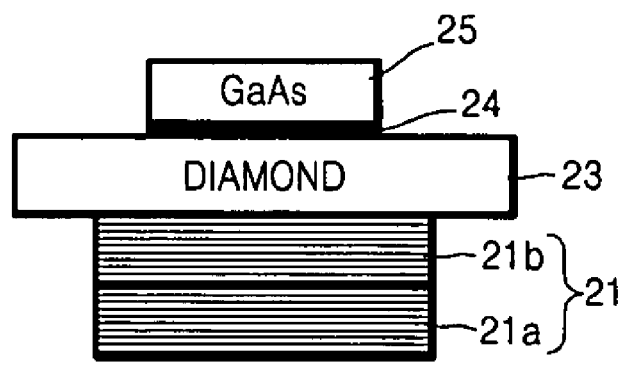
FIG. 3 is a schematic view of a laser chip and etalon filter layers according to an embodiment of the present invention.

Referring to FIG. 3, the laser chip 21 includes an active layer 21b and a Distributed Bragg Reflector (DBR) layer 21a. As is well known in the art, the active layer 21b has a multiple quantum well structure having a resonant periodic gain (RPG) structure, and is excited to emit light at a predetermined wavelength. The DBR layer 21a is a highly reflective mirror layer which reflects the laser light generated in the active layer 21b to an external mirror to resonate the laser light between the external mirror and the DBR layer 21a. Generally, the quantum wells constituting the active layer 21b are located at anti-nodes of a standing wave of the laser light having a main wavelength among the laser light resonating between the DBR layer 21a and the external mirror.

Referring to FIG. 3, the laser chip 21 includes an active layer 21b and a Distributed Bragg Reflector (DBR) 21a. As is well known in the art, the active layer 21b has a multiple quantum well structure having a resonant periodic gain (RPG) structure, and is excited to emit light at a predetermined wavelength. The DBR layer 21a is a highly reflective mirror layer which reflects the laser light generated in the active layer 21b to an external mirror to resonate the laser light between the external mirror and the DBR layer 21a. Generally, the quantum wells constituting the active layer 21b are located at anti-nodes of a standing wave of the laser light having a main wavelength among the laser light resonating between the DBR layer 21a and the external mirror.

First and second etalon filter layers 23 and 25 are composed of a material which is transmissive to the laser light generated in the active layer 21b. The first and second etalon filter layers 23 and 25 reduce the FWHM of the laser light that is generated in the active layer 21b and resonates between the DBR layer 21a and the external mirror. The reduction of the FWHM by the first and second etalon filter layers 23 and 25 will be described in more detail later. The first etalon filter layer 23, in particular, may simultaneously function as a heat spreader to exhaust heat generated in the laser chip 21. Accordingly, the first etalon filter layer 23 may be composed of the same material as a heat spreader, for example, diamond, silicon carbide (SiC), or $Al_2O_3$, which have high heat conductivity. The second etalon filter layer 25 is composed of a material having a different refractive index than the first etalon filter layer 23. For example, the second etalon filter layer 25 may be composed of GaAs, InP, SiC, diamond, or $Al_2O_3$.

The coating layer 24 increases the transmittance of the laser light at an interface between the first etalon filter layer 23 and the second filter layer 25. For this, the coating layer 24 may be formed by alternately stacking two semiconductor materials or dielectric materials having different refractive indexes. For example, when a semiconductor material is used, a GaAs layer and an AlAs layer can be alternately stacked to form the coating layer 24. However, an increase in the number of layers results in an increase of the reflectivity of the coating layer 24. Thus, the coating layer may include 2 or 3 pairs of the semiconductor material layers. The inclusion of the coating layer 24 is optional, and the second etalon filter layer 25 can be formed directly on the first etalon filter layer 23, without the coating layer 24 therebetween.

The reduction in the FWHM of the laser light in the above described structure will now be described.

Generally, laser light resonating in a cavity between the DBR layer 21a and the external mirror does not have a single wavelength, but has a spectrum with a peak at a main wavelength. The spectrum is not continuous, but contains several discontinuous wavelengths satisfying the resonance condition. However, when the cavity is long, the spaces between the discontinuous wavelengths become relatively small, and thus the spectrum can be regarded as continuous. In this case, the FWHM of the laser light is the distance between two points of the spectrum where the intensity is half the maximum intensity.

The first and second etalon filter layers 23 and 25 in the present embodiment are Fabry-Perot etalon filters which separate wavelengths in a predetermined mode from the wavelengths of laser light. That is, the laser light generated in the active layer 21b and incident on the first etalon filter 23 is partially reflected at the interface between the first etalon filter layer 23 and the second etalon filter layer 25 and then at the interface between the first etalon filter layer 23 and the active layer 21b. As a result, the laser light is repetitively reflected between a top surface and a bottom surface of the first etalon filter layer 23, and the light interferes with itself inside the first etalon filter layer 23. Thus the transmittance of the first etalon filter layer 23 is changed periodically according to wavelength variation. That is, only the laser light having wavelengths whose integral multiples correspond to the optical distance between the top surface and the bottom surface of the first etalon filter layer 23 is emitted through the top surface of the first etalon filter layer 23. Accordingly, only laser light at wavelengths in a predetermined mode passes through the first etalon filter layer 23, and thus the FWHM of the laser light is reduced. For example, when diamond having a thickness of 500 μm is used as the first etalon filter layer 23, the free spectral range (FSR) is about 0.8 nm and the FWHM is about 0.3 nm.

The laser light emitted from the first etalon filter layer 23 transmits through the coating layer 24 again and is incident on the second etalon filter layer 25. The same phenomenon occurs inside the second etalon filter layer 25. Accordingly, only the laser light at predetermined wavelengths pass through the second etalon filter layer 25, and thus the FWHM of the laser light is further reduced. In the present embodiment, the refractive index of the first etalon filter layer 23 is different than the refractive index of the second etalon filter layer 25 so that laser light can be reflected at the interface between the first etalon filter layer 23 and the second filter layer 25.

Figure 4:
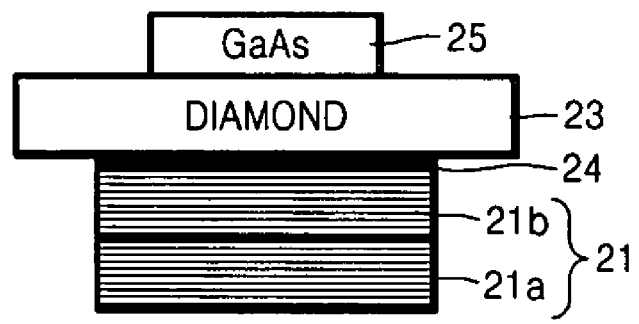
FIG. 4 is a schematic view of a laser chip and etalon filter layers according to another embodiment of the present invention.

The structure shown in FIG. 4 is identical to the structure shown in FIG. 3, except that the coating layer 24 is formed between the laser chip 21 and the first etalon filter layer 23 in FIG. 4 and not between the first etalon filter layer 23 and the second etalon filter layer 25. As described above, since the coating layer 24 functions only to improve the transmittance of light, the coating layer may be omitted.

Figure 5:
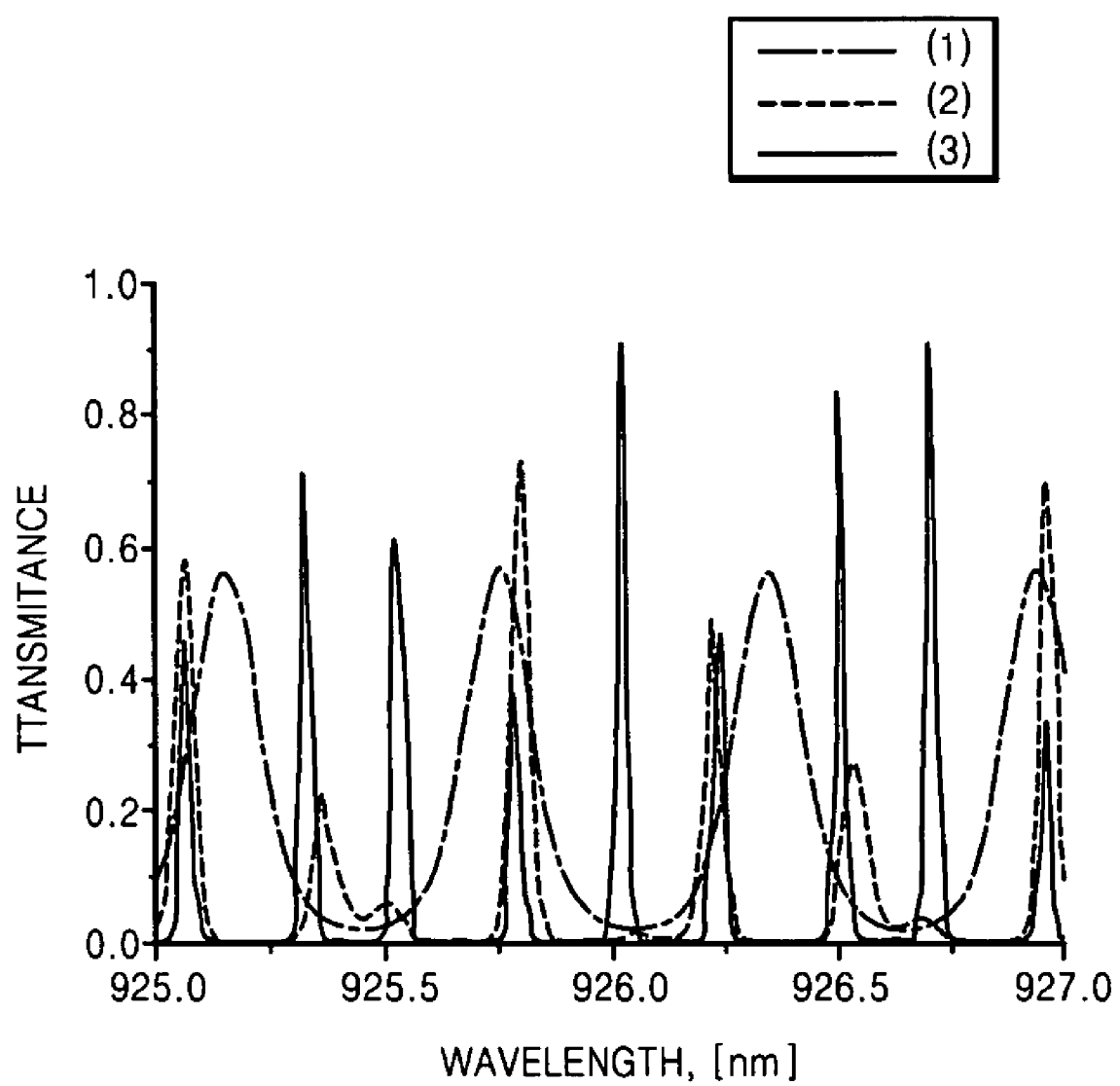
FIG. 5 illustrates-spectrums of the laser light in the VECSEL according to exemplary embodiments of the present invention in which two etalon filters are used and of a conventional VECSEL in which only a heat spreader is formed on a laser chip.

FIG. 5 illustrates variations of transmittance according to the wavelength of laser light transmitting the etalon filter layers. A curve (1) of FIG. 5 represents the case in which a heat spreader, that is, the first etalon filter layer, is formed on a laser chip in the conventional VECSEL. Curves (2) and (3) respectively represent the embodiments of FIGS. 3 and 4. As the curve (1) indicates, when only one heat spreader is formed on the laser chip, the laser light transmitted through the heat spreader has a relatively large FWHM of 0.19 nm. On the other hand, the laser light transmitted through the two etalon filter layers has a FWHM of 0.05 nm in FIG. 3, and a FWHM of 0.03 nm in FIG. 4.

As described before, the laser light in the infrared range output to the outside through the second mirror has a FWHM in the range of 0.26 to 0.3 nm in the conventional VECSEL. However, as illustrated in FIG. 5, as the laser light transmitted through the heat spreader has a FWHM of about 0.19 nm, the FWHM of the laser light increases during outputting to the outside. According to the present embodiment, since the FWHM of the laser light transmitted through two etalon filter layers is in the range of about 0.03 to 0.05 nm, the FWHM of the laser light may be narrow enough to improve the efficiency of the SHG crystal, considering the increase of the FWHM of the laser light to some extent when the laser light is output.

Figure 6:
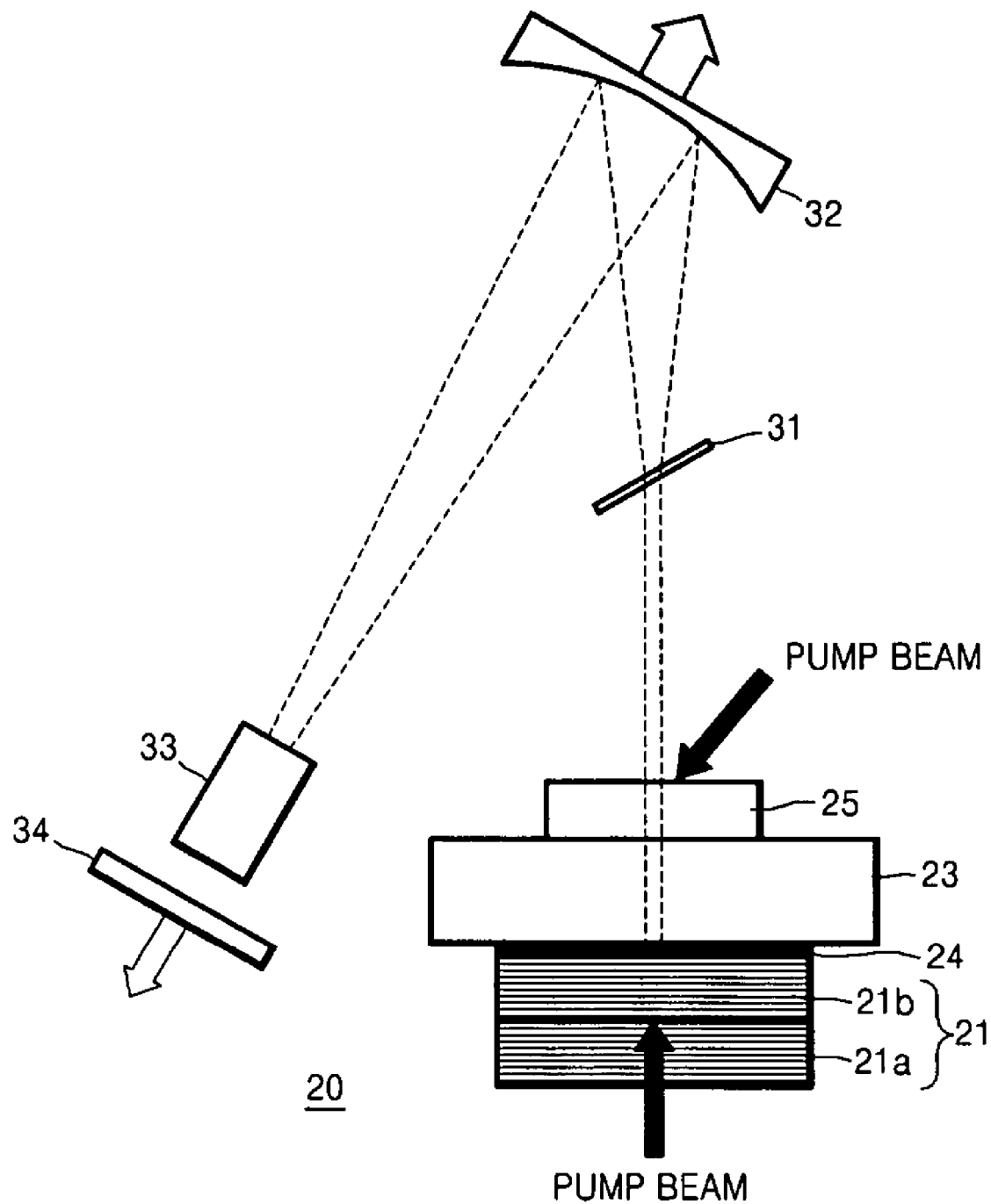
FIG. 6 is a schematic view of a VECSEL according to an embodiment of the present invention.
Figure 7:
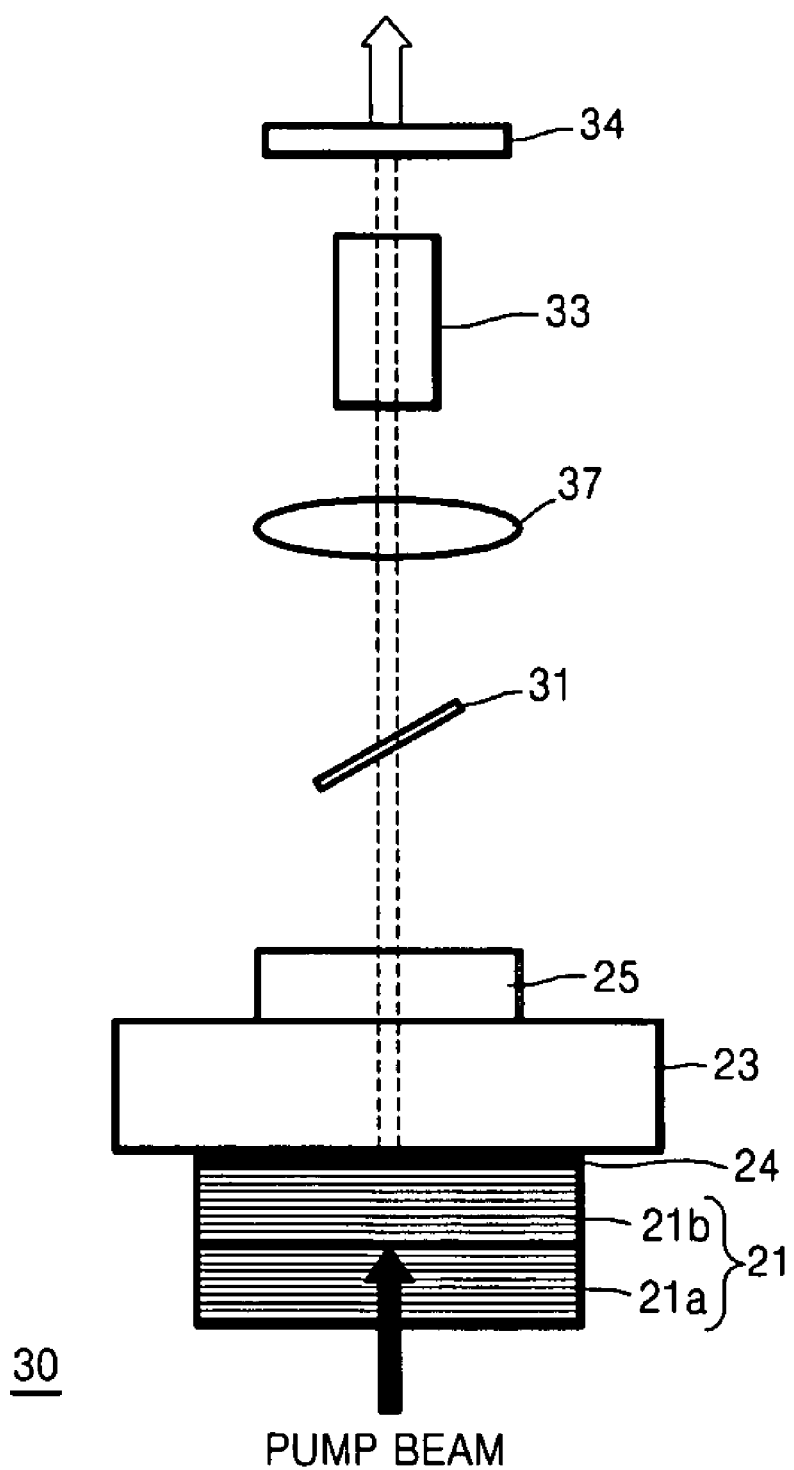
FIG. 7 is a schematic view of a VECSEL according to another embodiment of the present invention.

FIGS. 6 and 7 illustrate completed examples of VECSELs 20 and 30 including the structure of FIG. 4.

Referring to FIG. 6, the VESCEL according to an embodiment of the present invention includes a laser chip 21, which includes a DBR layer 21a and an active layer 21b, a coating layer 24 formed on the laser chip 21, a first etalon filter layer 23 on the coating layer 24, a second etalon filter layer 25 formed on the first etalon filter layer 23, a first mirror 32 separated from the laser chip 21 and disposed obliquely, a second mirror 34 reflecting the laser light reflected from the first mirror 32 back to the first mirror 32 to form a cavity with the DBR layer 21a, and an SHG crystal 33 disposed along an optical path between the first mirror 32 and the second mirror 34. A birefringence filter 31 may be further included along the optical path between the laser chip 21 and the first mirror 32. The first mirror 32 and the second mirror 34 may be coated to have various reflectivities and transmittances according to the wavelength of the light. For example, the first mirror 32 may have slight transmittance to the laser light whose wavelength is converted by the SHG crystal 33, and may have high reflectivity with respect to the light whose wavelength is not converted. The second mirror 34 has high reflectivity with respect to the laser light whose wavelength is converted, and slight transmittance with respect to the laser light whose wavelength is not converted.

The VECSEL 20 illustrated in FIG. 6 includes the structure of FIG. 4, but as described above, the location of the coating layer 24 can vary or be omitted. A pumping beam may be incident on a bottom surface or a top surface of the laser chip 21 according to the location of a pump laser (not shown). The birefringence filter 31 transmits laser light at a predetermined wavelength among the laser light transmitted through the second etalon filter layer 25 to allow only the laser light at a predetermined wavelength to resonate.

The laser light transmitted through the birefringence filter 31 is reflected by the first mirror 32 and passes through the SHG crystal 33. Generally, the converting efficiency of the SHG crystal 33 increases as the intensity of the incident light increases. Accordingly, a reflective surface of the first mirror 32 may be concave so that the laser light can be focused on the SHG crystal 33. The laser light whose frequency has been doubled by the SHG crystal 33, for example, the laser light in the visible light range, is reflected by the second mirror 34 back to the first mirror 32 and output to the outside through the first mirror 32. Accordingly, the second mirror 34 has very high reflectivity with respect to the laser light whose frequency has been converted by the SHG crystal 33, for example, about 99.9%. The reflective surface of the second mirror 34 may be planar so that the reflected light can return along its incident path. The laser light with the unconverted frequency, for example, the laser light in the infrared range, is reflected from the first mirror 32 and resonates between the second mirror 34 and the DBR layer 21a, and can be output to the outside through the second mirror 34.

Referring to FIG. 7, the VECSEL 30 according to another embodiment of the present invention includes a laser chip 21 including a DBR layer 21a and an active layer 21b, a coating layer 24 formed on the laser chip 21, a first etalon filter layer 23 on the coating layer 24, a second etalon filter layer 25 formed on the first etalon filter layer 23, a second mirror 34 separated from and facing the laser chip 21, and an SHG crystal 33 disposed along an optical path between the second mirror 34 and the laser chip 21. As described above, the location of the coating layer 24 can vary or be omitted. A pumping beam may be incident on a bottom surface or a top surface of the laser chip 21 according to the location of a pump laser (not shown).

As illustrated in FIG. 7, a birefringence filter 31 that transmits only laser light at a predetermined wavelength among the laser light transmitted by the second etalon filter layer 25 may be further included. Furthermore, a lens 37 focusing the laser light onto the SHG crystal 33 may be included between the birefringence filter 31 and the SHG crystal 33 to improve the conversion efficiency of the SHG crystal 33. The lens 37 may be, for example, a convex lens.

Accordingly, the VECSEL 30 of FIG. 7 includes the lens 37 in place of the first mirror 32 of FIG. 6. In the VECSEL 30 of FIG. 7, the laser light is repeatedly reflected and resonated between the second mirror 34 and the DBR layer 21a. The second mirror 34 has a predetermined transmittance with respect to the laser light whose frequency is converted by the SHG crystal 33, and thus a portion of the laser light whose frequency is converted can be output vertically to the outside through the second mirror 34.

As described above, according to certain embodiments of the present invention, the FWHM of the laser light can be reduced by using etalon filters without increasing the thicknesses of the birefringence filter and the heat spreader. Therefore, the wavelength conversion efficiency of the SHG crystal can be increased at low costs. As a result, a VECSEL whose output power is improved and which has a very short output spectrum can be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical external cavity surface emitting laser (VECSEL) comprising:
    a laser chip for generating laser light at a predetermined wavelength;
    a first etalon filter layer formed on the laser chip and configured to filter wavelengths outside of a first predetermined mode of the laser light;
    a second etalon filter layer that is formed on the first etalon filter layer, has a different refractive index than the first etalon filter layer, and is configured to filter wavelengths outside of a second predetermined mode of the laser light, the first and second etalon filter layers being configured to reduce a full-width at half maximum (FWHM) of the laser light;
    a first mirror separated from and disposed obliquely to the laser chip;
    a second mirror for reflecting the laser light reflected from the first mirror back to the first mirror to form a cavity with the laser chip; and
    a second harmonic generation (SHG) crystal that is disposed along an optical path between the first mirror and the second mirror and configured to double the frequency of the laser light generated in the laser chip.

2. The VECSEL of claim 1, wherein the first etalon filter layer and the second etalon filter layer have transmittance with respect to the laser light generated in the laser chip.

3. The VECSEL of claim 2, wherein the first etalon filter layer is a heat spreader configured to exhaust heat generated in the laser chip.

4. The VECSEL of claim 3, wherein the first etalon filter layer is formed of a material selected from the group consisting of diamond, $Al_2O_3$, and silicon carbide (SiC).

5. The VECSEL of claim 2, wherein the second etalon filter layer is formed of a material selected from the group consisting of GaAs, InP, SiC, diamond, and $Al_2O_3$.

6. The VECSEL of claim 1, further comprising a coating layer interposed between the laser chip and the first etalon filter layer to increase the transmittance of the laser light at the interface between the laser chip and the first etalon filter layer.

7. The VECSEL of claim 6, wherein the coating layer includes two alternately stacked semiconductor materials or two alternately stacked dielectric materials having different refractive indexes.

8. The VECSEL of claim 1, further comprising a coating layer interposed between the first etalon filter layer and the second etalon filter layer to increase the transmittance of the laser light at the interface between the first and second etalon filter layers.

9. The VECSEL of claim 8, wherein the coating layer includes two alternately stacked semiconductor materials or two alternately stacked dielectric materials having different refractive indexes.

10. The VECSEL of claim 1, further comprising a birefringence filter disposed between the first mirror and the laser chip to transmit the laser light at the predetermined wavelength.

11. The VECSEL of claim 1, wherein the second mirror has predetermined transmittance with respect to a first portion of the laser light whose frequency is not converted by the SHG crystal, and the first mirror has a predetermined transmittance with respect to a second portion of the laser light whose frequency is converted by the SHG crystal.

12. The VECSEL of claim 11, wherein the first mirror is a concave mirror and the second mirror is a planar mirror.

13. A vertical external cavity surface emitting laser (VECSEL) comprising:
    a laser chip for generating laser light at a predetermined wavelength;
    a first etalon filter layer formed on the laser chip and configured to filter wavelengths outside of a first predetermined mode of the laser light;

a second etalon filter layer that is formed on the fist etalon filter layer, a different refractive index than the first etalon filter layer, and is configured to filter wavelengths outside of a second predetermined mode of the laser light, the first and second etalon filter layers being configured to reduce a full-width at half maximum (FWHM) of the laser light;

a mirror for reflecting the laser light generated in the laser chip back to the laser chip to cause the laser light to resonate between the laser chip and the mirror; and a second harmonic generation (SHG) crystal disposed along an optical path between the laser chip and the mirror and configured to double the frequency of the laser light emitted from the laser chip.

14. The VECSEL of claim 13, wherein the first etalon filter layer and the second filter layer have transmittance with respect to the laser light generated in the laser chip.

15. The VECSEL of claim 14, wherein the first etalon filter layer is a heat spreader configured to exhaust heat generated in the laser chip.

16. The VECSEL of claim 15, wherein the first etalon filter layer is formed of a material selected from the group consisting of diamond, $Al_2O_3$, and silicon carbide (SiC).

17. The VECSEL of claim 14, wherein the second etalon filter layer is formed of a material selected from the group consisting of GaAs, InP, SiC, diamond, and $Al_2O_3$.

18. The VECSEL of claim 13, further comprising a coating layer interposed between the laser chip and the first etalon filter layer to increase the transmittance of the laser light at the interface between the laser chip and the first etalon filter layer.

19. The VECSEL of claim 18, wherein the coating layer includes two alternately stacked semiconductor materials or two alternately stacked dielectric materials having different refractive indexes.

20. The VECSEL of claim 13, further comprising a coating layer interposed between the first etalon filter layer and the second etalon filter layer to increase the transmittance of the laser light at the interface between the first and second etalon filter layers.

21. The VECSEL of claim 20, wherein the coating layer includes two alternately stacked semiconductor materials or two alternately stacked dielectric materials having different refractive indexes.

22. The VECSEL of claim 13, further comprising a birefringence filter disposed between the first mirror and the laser chip to transmit the laser light at the predetermined wavelength.

23. The VECSEL of claim 22, further comprising a lens disposed between the birefringence filter and the SHG crystal to focus the laser light on the SHG crystal.

24. The VECSEL of claim 13, wherein the laser chip comprises:

an active layer for generating the laser light upon excitation by a pumping beam, the active layer including a multiple quantum well structure and being positioned beneath the first etalon filter layer; and a Distributed Bragg Reflector (DBR) layer for reflecting the laser light generated in the active layer to the mirror, the DBR layer being positioned beneath the active layer.

25. The VECSEL of claim 24, wherein the pumping beam is directed to the bottom surface of the DBR layer and thence incident on the active layer.

26. The VECSEL of claim 1, wherein the laser chip includes:

an active layer for generating the laser light upon excitation by a pumping beam, the active layer including a multiple quantum well structure and being positioned beneath the first etalon filter layer; and a Distributed Bragg Reflector (DBR) layer for reflecting the laser light generated in the active layer to the first mirror, the DBR layer being positioned beneath the active layer.

27. The VECSEL of claim 26, wherein the pumping beam is directed to the bottom surface of the DBR layer and thence incident on the active layer.

28. The VECSEL of claim 26, wherein the pumping beam is directed to the top surface of the second etalon filter layer and thence incident on the active layer.

29. The VECSEL of claim 1, wherein the first etalon filter layer is configured to pass wavelengths in the first predetermined mode of the laser light therethrough, and the second etalon filter layer is configured to pass wavelengths in the second predetermined mode of the laser light therethrough.

30. The VECSEL of claim 13, wherein the first etalon filter layer is configured to pass wavelengths in the first predetermined mode of the laser light therethrough, and the second etalon filter layer is configured to pass wavelengths in the second predetermined mode of the laser light therethrough.

31. The VECSEL of claim 1, wherein the second etalon filter layer is formed continuously on the first etalon filter layer.

32. The VECSEL of claim 1, wherein the second etalon filter layer is configured to further reduce the FWHM of the laser light beyond the reduction of the FWHM of the laser light achieved by the first etalon filter layer.

33. The VECSEL of claim 13, wherein the second etalon filter layer is formed continuously on the first etalon filter layer.

34. The VECSEL of claim 13, wherein the second etalon filter layer is configured to further reduce the FWHM of the laser light beyond the reduction of the FWHM of the laser light achieved by the first etalon filter layer.

* * * * *